(12) United States Patent
Kim et al.

(10) Patent No.: US 7,807,082 B2
(45) Date of Patent: Oct. 5, 2010

(54) APPARATUS FOR FABRICATING FLAT PANEL DISPLAY DEVICE AND METHOD FOR FABRICATING THEREOF

(75) Inventors: Jin Wuk Kim, Gyeonggi-do (KR); Bo Hyun Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 11/454,976

(22) Filed: Jun. 19, 2006

(65) Prior Publication Data

US 2007/0165181 A1    Jul. 19, 2007

(30) Foreign Application Priority Data

Dec. 26, 2005    (KR) ............... 10-2005-0129598

(51) Int. Cl.
    B29C 59/00    (2006.01)
    B29C 33/38    (2006.01)
    G02F 1/13     (2006.01)

(52) U.S. Cl. ............... 264/219; 264/129; 264/227; 264/238; 427/133; 430/324; 438/780

(58) Field of Classification Search ............... 425/385, 425/386, 403, 810; 264/2.5, 129, 238, 250, 264/219, 131, 132, 220, 224–227, 338; 430/320, 430/321, 324; 438/780, 30; 156/345.3; 427/133, 427/256, 558; 216/41, 52

See application file for complete search history.

(56) References Cited

U.S. PATENT DOCUMENTS

| 3,534,440 | A | * | 10/1970 | Roberts | ............... 425/195 |
| 5,174,937 | A | * | 12/1992 | Tamura et al. | ............... 264/106 |
| 5,512,131 | A | * | 4/1996 | Kumar et al. | ............... 438/738 |
| 5,700,550 | A | * | 12/1997 | Uyama et al. | ............... 428/212 |
| 6,154,265 | A | * | 11/2000 | Kamio et al. | ............... 349/122 |
| 6,180,288 | B1 | * | 1/2001 | Everhart et al. | ............... 430/2 |
| 6,190,929 | B1 | * | 2/2001 | Wang et al. | ............... 438/20 |
| 6,518,168 | B1 | * | 2/2003 | Clem et al. | ............... 438/623 |
| 6,524,418 | B2 | * | 2/2003 | Yamasaki et al. | ............... 156/230 |
| 6,673,287 | B2 | * | 1/2004 | Breen et al. | ............... 264/83 |
| 6,699,665 | B1 | * | 3/2004 | Kim et al. | ............... 506/13 |
| 6,780,492 | B2 | * | 8/2004 | Hawker et al. | ............... 428/198 |

(Continued)

FOREIGN PATENT DOCUMENTS

GB    2420216 A    *    5/2006

(Continued)

OTHER PUBLICATIONS

Li et al.; "Parallel mixing of . . . microvalve arrays", May 11, 2005; Electrophoresis 2005, 26, 3758-3764.*

(Continued)

*Primary Examiner*—Philip C Tucker
*Assistant Examiner*—Dimple N Bodawala
(74) *Attorney, Agent, or Firm*—Morgan Lewis & Bockius LLP

(57) ABSTRACT

An apparatus for fabricating a flat panel display device including a preparation unit to form a thin film layer and a etch-resist on a substrate and a hard mold to mold the etch-resist, the hard mold including a back plate and a molding pattern.

4 Claims, 10 Drawing Sheets

U.S. PATENT DOCUMENTS

| | | | |
|---|---|---|---|
| 6,893,966 B2 * | 5/2005 | Delamarche et al. | 438/689 |
| 7,211,209 B2 * | 5/2007 | Kim et al. | 264/129 |
| 2002/0127499 A1 * | 9/2002 | Endo et al. | 430/327 |
| 2002/0130444 A1 * | 9/2002 | Hougham | 264/519 |
| 2003/0122495 A1 * | 7/2003 | Nakanishi | 315/169.3 |
| 2005/0039618 A1 * | 2/2005 | Heidari et al. | 101/368 |
| 2005/0079486 A1 * | 4/2005 | Abbott et al. | 435/5 |
| 2006/0105487 A1 | 5/2006 | Kim | |
| 2006/0290024 A1 * | 12/2006 | Jo et al. | 264/219 |
| 2007/0119048 A1 * | 5/2007 | Li et al. | 29/623.5 |
| 2007/0138131 A1 * | 6/2007 | Burdinski | 216/41 |

FOREIGN PATENT DOCUMENTS

| | | | |
|---|---|---|---|
| JP | 05212727 A | * | 8/1993 |
| JP | 2001191345 A | * | 7/2001 |
| JP | 2005196168 A | * | 7/2005 |
| JP | 2005197669 A | * | 7/2005 |
| WO | WO 2005033189 A1 | * | 4/2005 |

OTHER PUBLICATIONS

Kang et al.; "An improved method of preparing . . . moulds"; Dec. 1, 2005; Institute of Physic Publishing, Nanotechnology 17, 197-200.*
Xia et al.; "Soft Lithography"; Annu. Rev. Mater. Sci. 1998.28: 153-84.*

* cited by examiner

APPARATUS FOR FABRICATING FLAT PANEL DISPLAY DEVICE AND METHOD FOR FABRICATING THEREOF

The present invention claims the benefit of Korean Patent Application No. P2005-0129598 filed in Korea on Dec. 26, 2005, which is hereby incorporated by reference.

BACKGROUND OF THE INVENTION

1. Field of the Invention

The present invention relates to a flat panel display device, and more particularly, to a method and apparatus for fabricating a flat panel display device.

2. Discussion of the Related Art

In the current information-driven society, display devices are increasingly emphasized in importance as a visual communication medium. Cathode ray tubes or Braun tubes, which remain in the product mainstream are disadvantageous due to their large size and weight.

Flat panel display technology includes liquid crystal display (LCD) devices, field emission display (FED) devices, plasma display panel (PDP) devices, electroluminescence display (ELD) devices, and the like. Liquid crystal display devices satisfy the demand for light, thin, and small electronic products. Further, their productivity has improved. Thus, liquid crystal display devices have been rapidly replacing the cathode ray tubes in many applied fields.

An active matrix type liquid crystal display device, which drives a liquid crystal cell by use of a thin film transistor (hereinafter, "TFT"), has advantages including excellent picture quality and low power consumption. Further, it has rapidly been developed to be made with large-size and high-resolution characteristics due to mass production technology.

The active matrix type liquid crystal display device, as shown in FIG. 1, includes a color filter substrate 22 and a TFT array substrate 23 bonded together with a liquid crystal layer 15 formed therebetween. The color filter substrate 22 includes a color filter 13 and a common electrode 14 formed on the rear surface of an upper glass substrate 12. A first polarizer 11 is attached onto the front surface of the upper glass substrate 12. The color filter 13 has red (R), green (G) and blue (B) color filter layers arranged to transmit a light of a specific wavelength range, thereby enabling the display of color. A black matrix is formed between adjacent color filter layers R, G, and B.

In the TFT array substrate 23, data lines 19 and gate lines 18 cross each other on the front surface of a lower substrate 16, and a TFT 20 is formed at each intersection thereof. A pixel electrode 21 is formed at a cell area between the data line 19 and the gate line 18 on the front surface of the lower substrate 16. The TFT 20 switches a data transmission path between the data line 19 and the pixel electrode 21 in response to a scan signal from the gate line 18, thereby driving the pixel electrode 21. The second polarizer 17 is attached to the rear surface of the TFT array substrate 23.

A liquid crystal layer 15 controls the transmitted amount of light that is incident to the TFT array substrate 23 by an electric field applied thereto. The first polarizer 11 and the second polarizer 17 of the color filter substrate 22 and the TFT array substrate 23, respectively, transmit a polarized light in any one direction. When the liquid crystal layer 15 is in a 90° TN mode, the polarizing directions cross each other perpendicularly. An alignment film (not shown) is formed in contact with the liquid crystal layer 15 disposed between the color filter substrate 22 and the TFT array substrate 23.

Generally, a process of fabricating the active matrix type liquid crystal display device is divided into a substrate cleaning process, a substrate patterning process, an alignment film forming/rubbing process, a substrate bonding/liquid crystal injecting process, a mounting process, an inspection process, a repair process, and so on. The substrate cleaning process removes impurities, which contaminate a substrate surface, with a cleaning solution. The substrate patterning process is divided into a patterning process of the color filter substrate 22 and a patterning process of the TFT array substrate 23 to form the respective substrates. The alignment film forming/rubbing process spreads an alignment film over each of the color filter substrate 22 and the TFT array substrate 23, and rubs the alignment film with a rubbing cloth. The substrate bonding/liquid crystal injecting process bonds the color filter substrate 22 with the TFT array substrate 23 by use of a sealant, injects liquid crystal material through a liquid crystal injection hole, and then seals up the liquid crystal injection hole. The mounting process connects a tape carrier package (hereinafter, "TCP") to a pad part of the substrate, wherein the TCP has an integrated circuit (IC), such as a gate drive IC, and a data drive IC mounted thereon. The IC can be directly mounted on the substrate by a chip-on-glass (hereinafter, "COG") method as well as a tape automated bonding (hereinafter, "TAB") method. The inspection process includes an electrical inspection that is performed after forming the pixel electrode 21 and the signal line, such as the data line 19 and the gate line 18, in the TFT array substrate 23. The electrical inspection and a macrography are performed after the substrate bonding/liquid crystal injecting process. The repair process performs a restoration of a TFT array substrate 23 that is judged to be repairable by the inspection process. A TFT array substrate 23 that is judged to be not repairable in the inspection process is disposed as waste.

In the fabricating method of most of the flat panel displays, including a liquid crystal display device, a thin film material deposited on the substrate is patterned by a photolithography process. The photolithography process is a series of photographic processes that generally include photo-resist spreading, mask aligning, exposure, development and cleaning processes. However, the photolithography process has problems. For example, time required for processing is long, photo-resist materials and strip solutions are greatly wasted, and expensive equipment, such as exposure equipment, is required.

A method and apparatus for fabricating a flat panel display device, described in U.S. patent application Ser. No. 11/154,649, filed on Jun. 17, 2005 and commonly assigned to the assignee of the present invention, is incorporated herein by reference and is briefly discussed below. In particular, FIG. 2 and FIG. 3 of the related art show a method and apparatus for fabricating a flat panel display device that form a thin film pattern by using a soft mold 134 instead of a photo-resist patterning process of the related art.

The thin film patterning process using the soft mold 134 includes a spreading process of an etch resist solution 133a on a substrate 131 provided with a thin film 132a, a patterning process of a layer of etch resist solution 133a using a soft mold 134, an etching process for patterning the thin film 132a, a stripping process for removing residual etching resist patterns, and an inspecting process.

The thin film 132a formed on the substrate 131 is formed from a base material, which is used as a metal pattern, an organic pattern, and an inorganic pattern that exist in an array of the flat panel display device on the substrate 131 by a known spreading process or deposition process. The etch resist solution 133a includes a main resin, which is one of a liquid polymer precursor, liquid monomer, an activator, an initiator, a thermal flow derivative, and the like. The etch resist solution 133a is spread over the thin film 132a by the spreading process, such as nozzle spraying, spin coating, and the like. The soft mold 134 is made of a rubber material with high elasticity such as polydimethylsiloxane (PDMS) and the like. The soft mold 134 includes a reference surface 134b and a groove 134a that is indented from the reference surface 134b. The groove 134a corresponds to a pattern to be made to remain on the substrate 131. Moreover, the groove 134a and the reference surface 134b are surface-treated to be either hydrophobic or hydrophilic. Hereinafter, an explanation will be made with respect to the soft mold 134 being hydrophobic.

The soft mold 134 is aligned on the etch resist solution 133a. The soft mold 134 is applied to the etch resist solution 133a with pressure with which the soft mold 134 can only be in contact with the thin film 132a, i.e., a pressure of only about its own weight. For example, the etch resist solution 133a, as shown in FIG. 3, moves into the groove 134a of the soft mold 134 by a capillary force that is generated by a pressure between the soft mold 134 and a glass substrate 131, and a repulsive force between the reference surface 134b and the etch resist solution 133a. As a result, the etch resist pattern 133b is formed on the thin film 132a in a pattern shaped by the groove 134a of the soft mold 134. After the soft mold 134 is separated from the substrate 131, a wet etching process or a dry etching process is performed. During the etching process, the etch resist pattern 133b acts as a mask. Thus, only the thin film 132a covered by the etch resist pattern 133b remains on the substrate 131 and the other exposed portions of the thin film 132a are removed. Subsequently, the etch resist pattern 133b is removed by the stripping process. Whether there is a short circuit or a broken wire from the thin film pattern 132b is then determined by electrical and optical inspections of the thin film pattern 132b. After the soft mold 134 is separated from the substrate 131, the soft mold 134 is cleaned by an ultraviolet ray and ozone $O_3$, and is reused in the patterning process of another thin film 132a.

A method of fabricating the soft mold 134 shown in FIG. 2 and FIG. 3 is explained as follows. As shown in FIG. 4, a molding material 135, which includes polydimethylsiloxane and a small amount of curing agent, is coated on a master mold 184 provided with at least one pattern 182 of a photoresist pattern and inorganic pattern on a substrate 180. At this stage, the molding material 135 is in a liquid polymer precursor state. After the molding material 135 is hardened by an ultraviolet ray hardening or a heat hardening process, the hardened molding material 135 is separated from the master mold 184 to form the soft mold 134 having the reference surface 134b and the groove 134a.

The thin film pattern 132b is formed by using the above-mentioned soft mold 134, so that it becomes possible to simplify the fabricating process of the flat panel display device in comparison to the related art photographic process. However, because the soft mold 134 formed by the above-described description is soft, a central area of the groove 134a sags when the area of the groove 134a (i.e., the area indented from the reference surface 134b) is wide. In other words, as shown in FIG. 5, if an area d2 of the groove 134a is relatively wider than an area d1 of the reference surface 134b, then the central area of the groove 134a sags in the vertical direction such that the desired etch-resist pattern 133b is not formed. Accordingly, the etch-resist pattern 133b may not be formed uniformly.

SUMMARY OF THE INVENTION

Accordingly, the present invention is directed to an apparatus for fabricating a flat panel display device and a method for fabricating thereof that substantially obviates one or more of the problems due to limitations and disadvantages of the related art.

An object of the present invention is to provide an apparatus and method for fabricating a flat panel display device that is adapted to simplify the fabricating process by performing a patterning process without a photographic process that is unaffected by gravity.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the apparatus for fabricating a flat panel display device and method for fabricating thereof includes an apparatus for fabricating a flat panel display device comprising a preparation unit to form a thin film layer and a etch-resist on a substrate, and a hard mold to mold the etch-resist, the hard mold including a back plate and a molding pattern.

In another aspect, a method of fabricating a mold for use in fabricating a flat panel display device comprises forming a substrate having a hydrophilic surface, forming a hydrophobic organic pattern on the substrate, forming a molding layer on the hydrophobic organic pattern, preparing a back plate, forming an adhesive layer on any one of the back plate and the molding layer, bonding the molding layer with the back plate using the adhesive layer, and separating the back plate and the molding layer from the substrate.

In another aspect, a hard mold for fabricating a flat panel display device comprises a back plate, a molding pattern, and an adhesive material positioned between the molding pattern and the back plate to attach the molding pattern to the back plate by the adhesive material.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
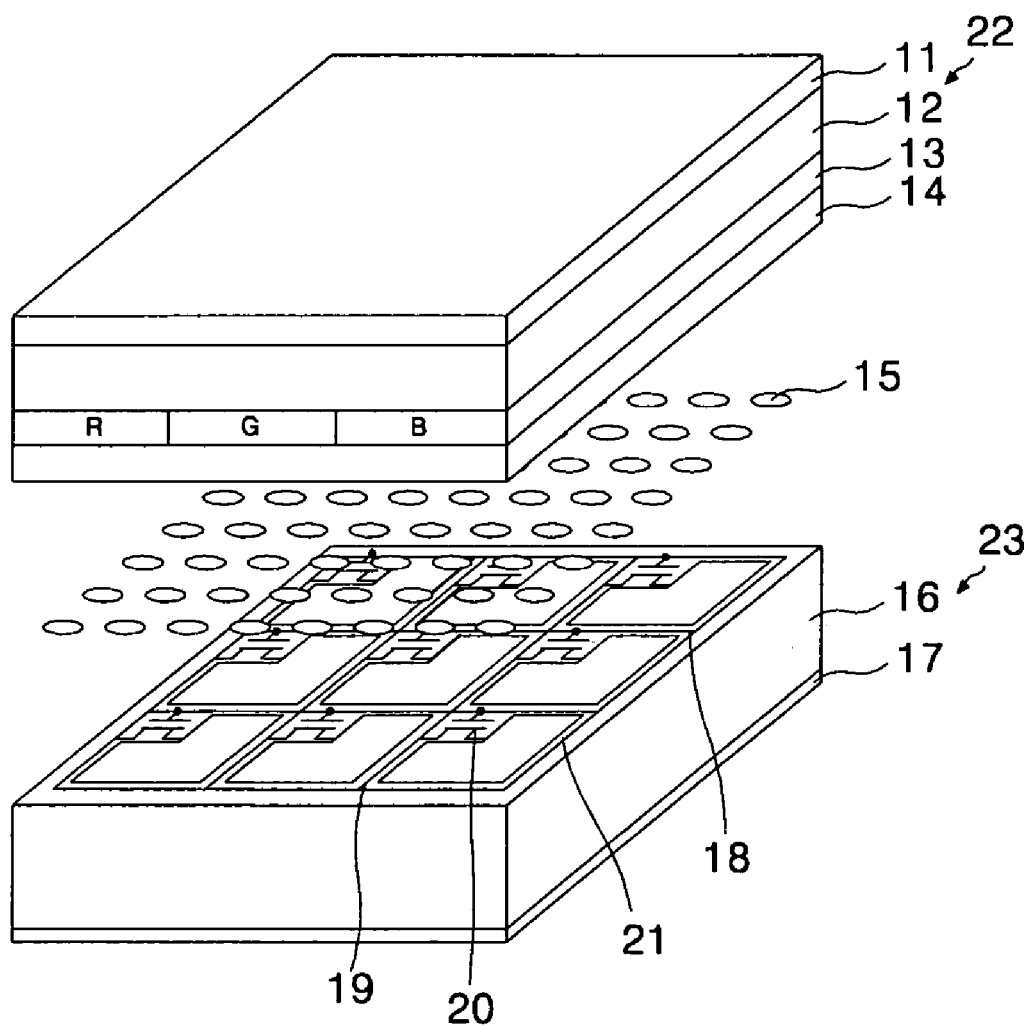
FIG. 1 is a perspective view showing an active matrix type liquid crystal display device.
Figure 2:
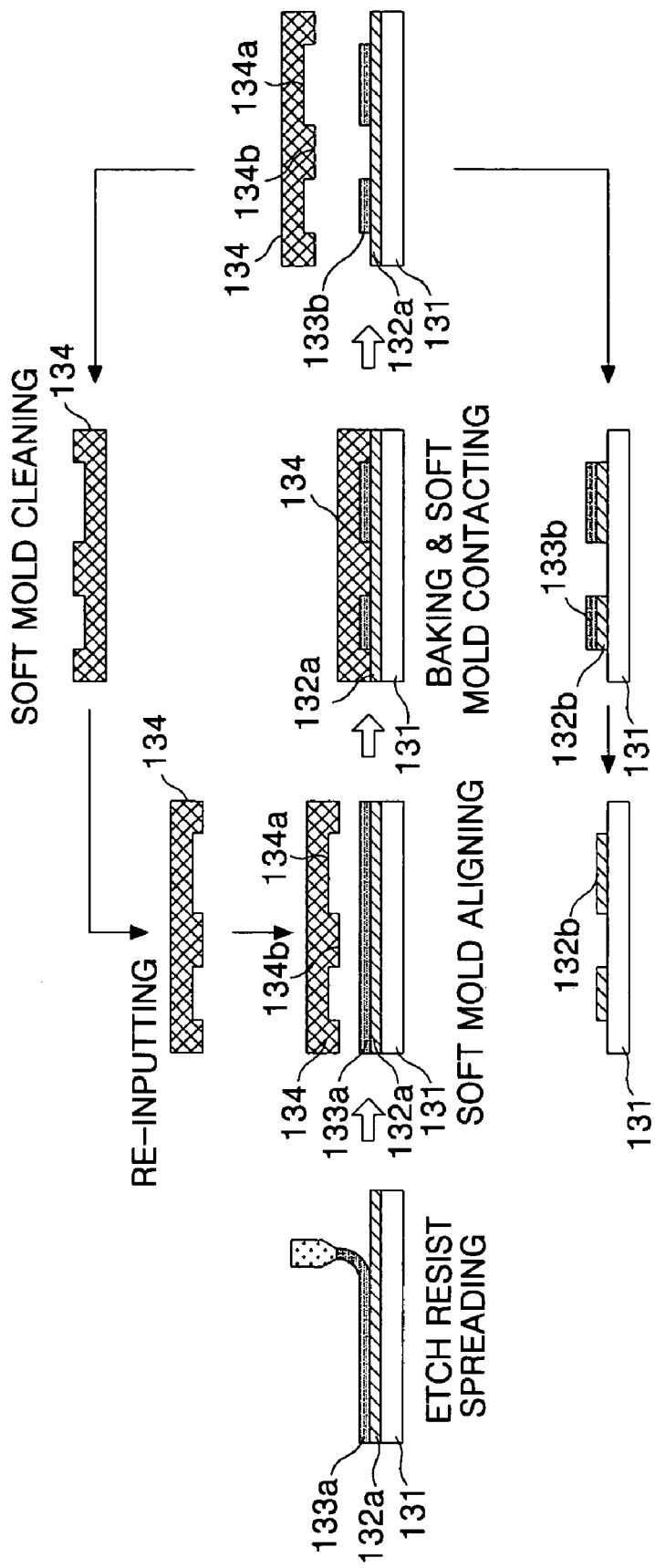
FIG. 2 is a diagram for explaining a method and apparatus for fabricating a flat panel display device using a soft mold.
Figure 3:
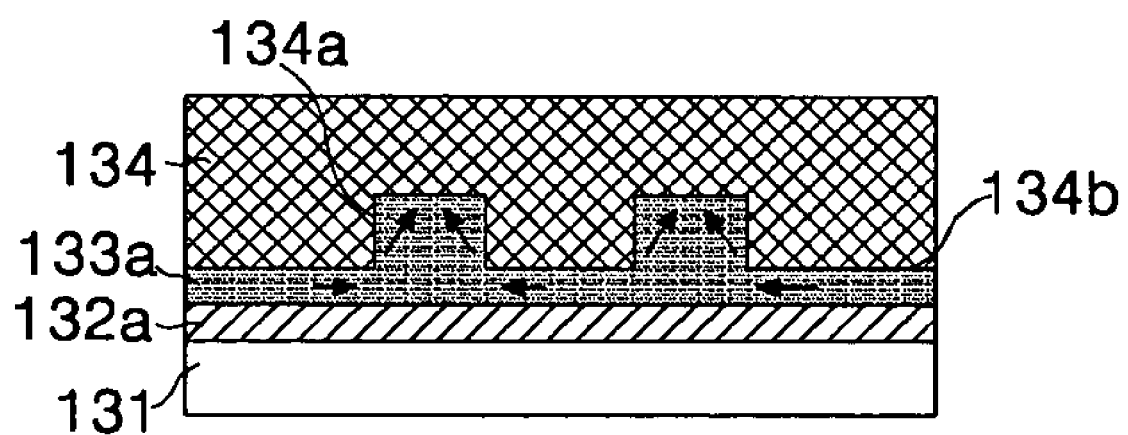
FIG. 3 is a diagram showing the soft mold shown in FIG. 2 applied to an etch-resist solution.
Figure 4:
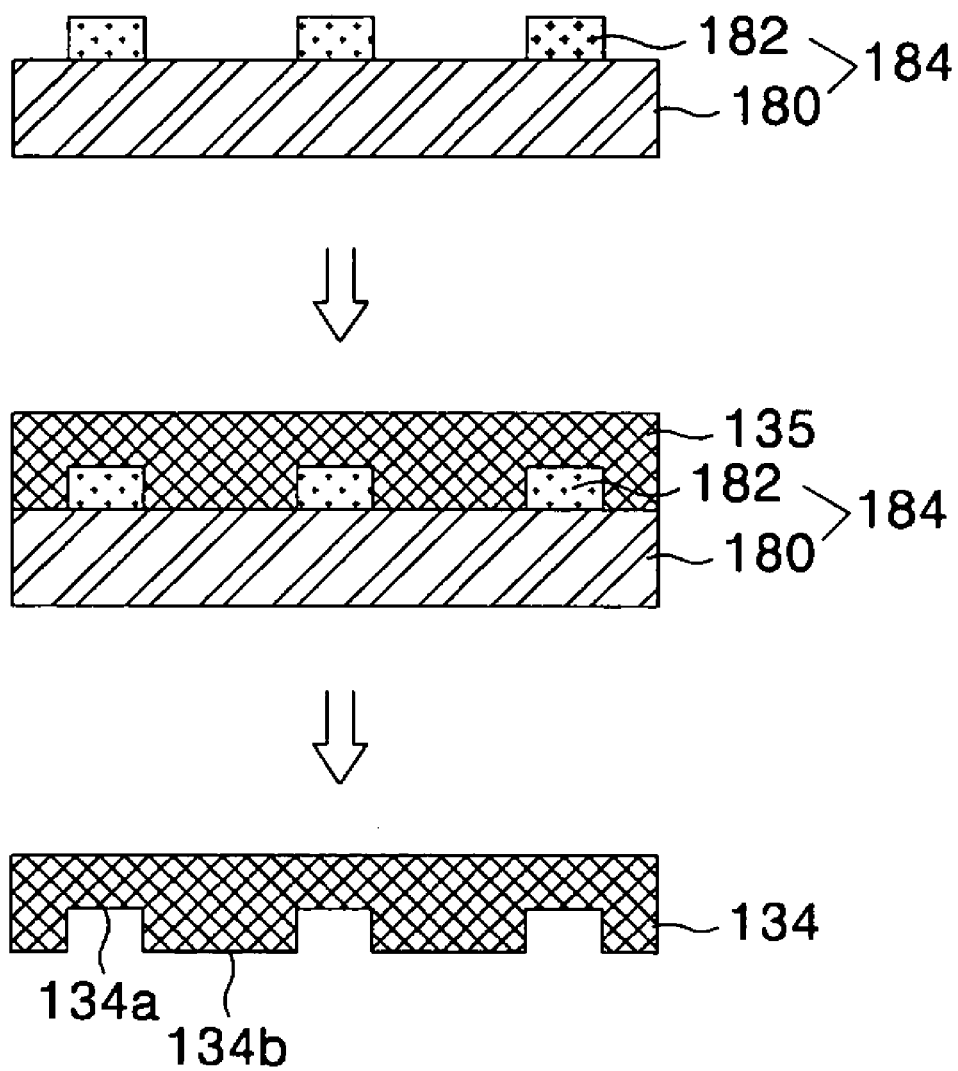
FIG. 4 is a diagram showing a process of fabricating the soft mold shown in FIG. 2 and FIG. 3.
Figure 5:
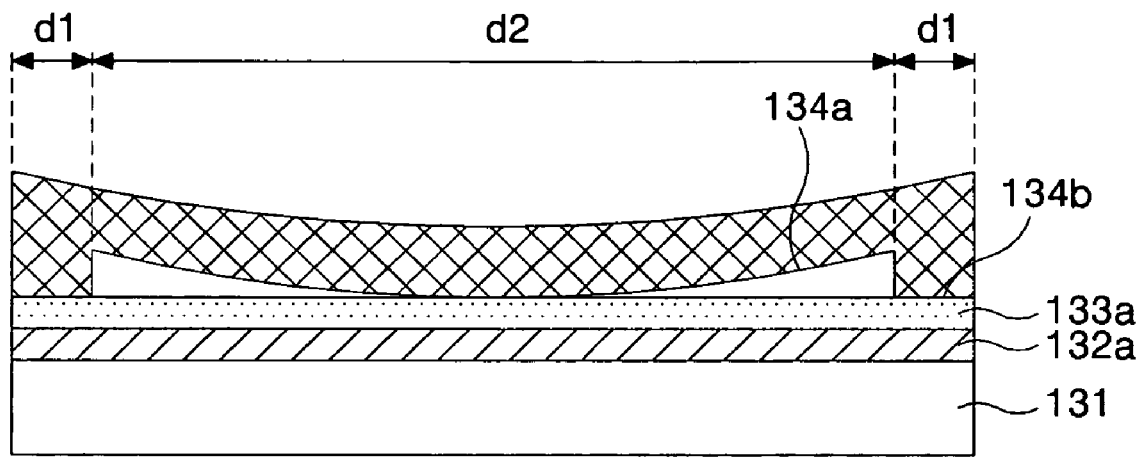
FIG. 5 is a diagram showing a sagging phenomenon occurring in the soft mold.
Figure 6:
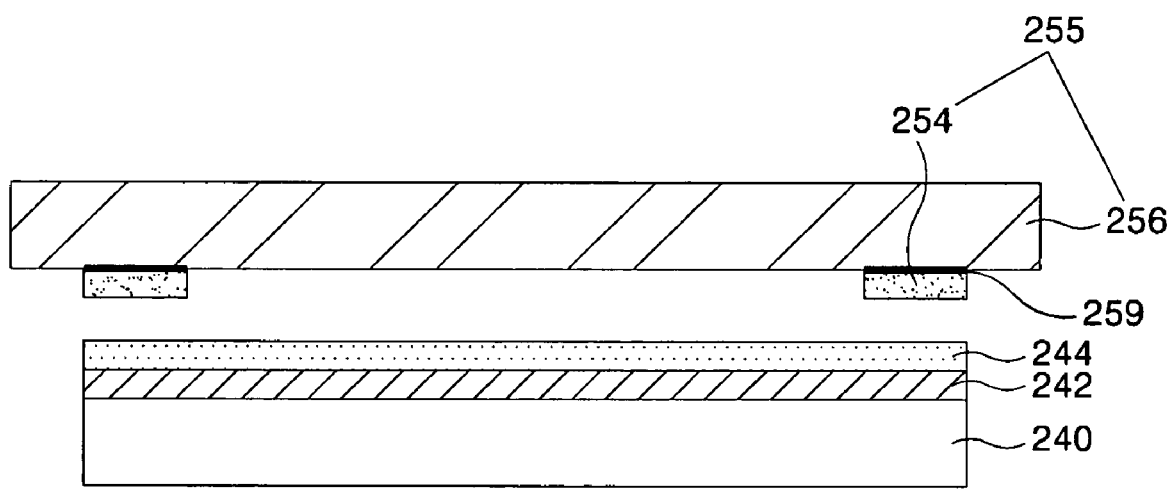
FIG. 6 is a diagram showing a hard mold according to an exemplary embodiment of the present invention.

FIG. 6 shows a diagram of a hard mold 255 used in fabricating a flat panel display device according to an exemplary embodiment of the present invention. The hard mold 255 differs from the soft mold 134 shown in FIG. 2 through FIG. 5 in that the hard mold 255 includes a back plate 256 having a high degree of hardness, a molding pattern 254 formed on the back plate 256 having a smaller area and line width than the back plate 256, and an adhesive material 259 positioned between the molding pattern 254 and the back plate 256.

The back plate 256 is formed of a material having a high degree of hardness, such as a metal or glass, so that it has a strong resistance against gravity as compared to the soft mold 134. The molding pattern 254 is formed of PDMS material. For example, the molding pattern 254 includes hexane of about 20 to about 30%, PDMS of about 65 to about 80%, and a curing agent of about 5 to about 15%. The height of the molding pattern 254 is higher than that of the etch-resist layer 244.

The etch-resist pattern is formed by applying the hard mold 255 against a substrate 240 provided with a thin film material 242 and the etch-resist layer 244. The hard mold 255 does not sag in the vertical direction as compared to the soft mold 134. In other words, the back plate 256 of the hard mold 255 is formed from a material having a high degree of hardness, such as metal or glass, so that the sagging phenomenon does not occur. Accordingly, it can solve the problem that appeared in the soft mold 134.

The method and apparatus for fabricating the flat panel display device according to the present invention forms the thin film pattern using the hard mold 255, without the need of a photographic process, thereby simplifying the fabricating process. At the same time, the back plate 256 of the hard mold 255 is formed from a material having a high degree of hardness, so that the sagging phenomenon does not occur by gravity. Accordingly, the normal etch-resist pattern can be formed with precision and accuracy.

A method of fabricating the harness mold 255 will be described in detail with reference to FIG. 7A to FIG. 7D.

Figure 7A:
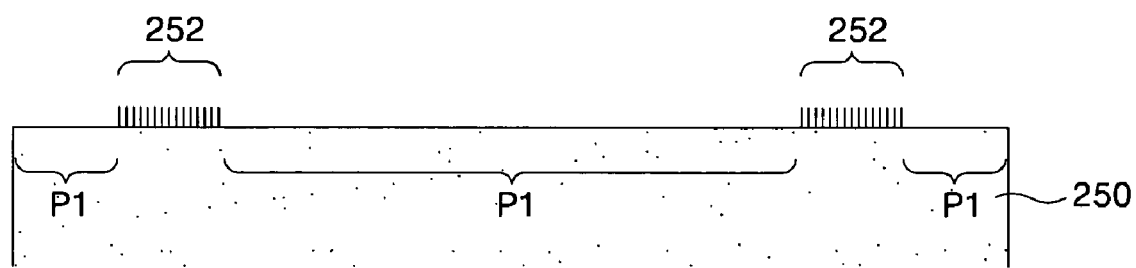
FIG. 7A to FIG. 7D are diagrams showing an exemplary method of fabricating the hard mold shown in FIG. 6.

As shown in FIG. 7A, a hydrophobic organic pattern 252 is formed on a hydrophilic substrate 250 processed by $O_2$ plasma processing or the like. The hydrophobic organic pattern 252 is a SAMS (self-assembled monolayers) type and is formed from a material such as alkyltrichlorosilane, alkanethiol, or the like. The hydrophobic organic pattern 252 is formed using a patterning process, such as microcontact printing. In microcontact printing, liquefied SAMS material is absorbed in the reference surface of the soft mold shown in FIG. 2 and FIG. 3, and the reference surface of the soft mold is contacted with the processed hydrophilic substrate 250 to transfer the liquefied SAMS material absorbed in the reference surface onto the substrate 250.

After the SAMS material is printed on the substrate 250, the SAMS material is surface-processed by using an ultraviolet ray to thereby provide the hydrophobic organic pattern 252 on the substrate 250, as shown in FIG. 7A. Accordingly, an area not covered by the hydrophobic organic pattern 252 is a hydrophilic area P1.

Figure 7B:
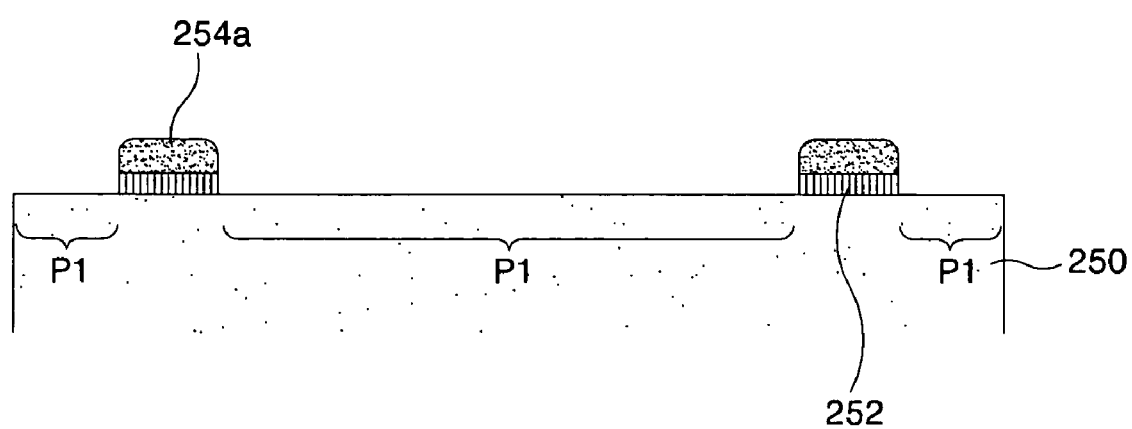

Next, as shown in FIG. 7B, a molding material 254a, such as a liquid polymer precursor, including hexane of about 20 to about 30%, PDMS of about 65 to about 80%, and a curing agent of about 5 to about 15% is coated on the substrate 250 provided with the hydrophobic organic pattern 252. Because the molding material 254a is hydrophobic, it has a repulsive force with the hydrophilic. Accordingly, the molding material 254a is patterned based on a repulsive force with the hydrophilic area P1 and an attractive force with the hydrophobic organic pattern 252, thereby allowing the molding material 254a to concentrate over the hydrophobic organic pattern 252.

Figure 7C:
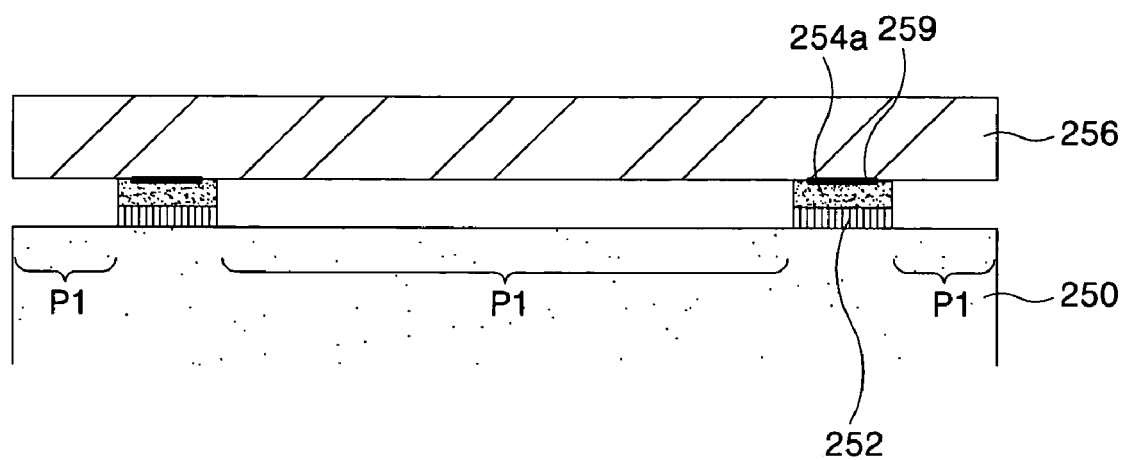

Thereafter, an adhesive material, such as a primer, is jetted or coated on the surface of the molding material 254a positioned on the hydrophobic organic pattern 252 or on the surface of the back plate 256. Next, as shown in FIG. 7C, the back plate 256, formed from a material with a high degree of hardness, such as metal or glass, is contacted with the molding material 254a positioned on the hydrophobic organic pattern 252. Then, the molding material 254a is hardened by using heat or an ultraviolet ray.

Figure 7D:
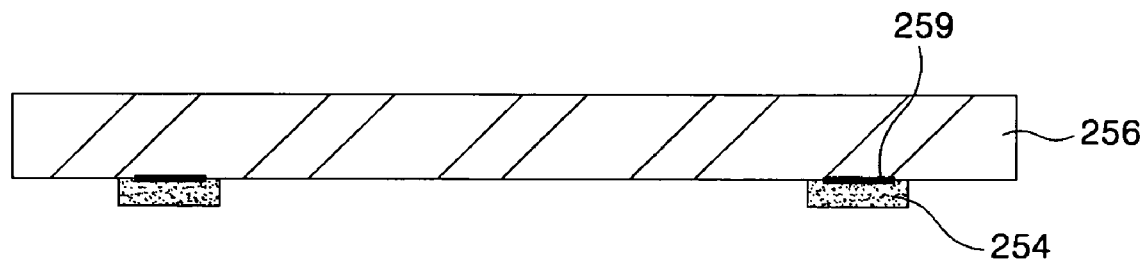

The back plate 256 is then separated from the substrate 250. At this time, the molding material 254a positioned on the hydrophobic organic pattern 252 is attached to back plate 256 by the adhesive material 259. Accordingly, as shown in FIG. 7D, the hard mold 255 including the back plate 256 and the molding pattern 254 is formed.

The method and apparatus for fabricating the flat panel display device according to the exemplary embodiment of the present invention can be applied to a process for patterning the electrode layer, the organic layer and the inorganic layer of flat panel displays, such as the liquid crystal display (LCD), the field emission display (FED), the plasma display panel (PDP), the electroluminescence display (ELD) and the like.

As described above, the method and apparatus for fabricating the flat panel display device according to the exemplary embodiment of the present invention forms the thin film pattern using the hard mold and the etch-resist, not by the photolithographic process, thereby simplifying the fabricating process. At the same time, the hard mold is formed from a material having a high degree of hardness, so that the sagging phenomenon does not occur. As a result, when the etch-resist is press-molded, an etch-resist pattern can be formed with precision and accuracy.

It will be apparent to those skilled in the art that various modifications and variations can be made in the apparatus for fabricating a flat panel display device and method for fabricating thereof includes of the present invention without departing from the spirit or scope of the invention. Thus, it is intended that the present invention cover the modifications and variations of this invention provided they come within the scope of the appended claims and their equivalents.

What is claimed is:

1. A method of fabricating a hard mold for use in fabricating patterns of a flat panel display device, comprising:
   forming a substrate having a hydrophilic surface processed by O2 plasma processing;
   forming a hydrophobic organic pattern including self-assembled monolayers on the substrate;
   forming a molding pattern on the hydrophobic organic pattern, wherein the molding pattern is hydrophobic and includes hexane of about 20 to about 30%, PDMS of about 65 to about 75%, and a curing agent of about 5 to about 15%;

preparing a back plate formed from a metallic or glass material;

forming an adhesive layer on any one of the back plate and the molding pattern;

bonding the molding pattern with the back plate using the adhesive layer;

hardening the molding pattern using heat or ultraviolet after bonding; and separating the back plate having the adhesive layer and the molding pattern from the substrate wherein the molding pattern is attached to the back plate by the adhesive layer.

2. The method according to claim 1, wherein forming the hydrophobic organic pattern includes:

forming self-assembled monolayers on the substrate; and processing a surface of the self-assembled monolayers by using an ultraviolet ray.

3. The method according to claim 2, wherein the self-assembled monolayers includes any one of alkyltrichlorosilane and alkanethiol.

4. The method according to claim 2, wherein step of forming the self-assembled monolayers on the substrate includes:

preparing a soft mold having a reference surface and a groove indented from the reference surface;

applying the self-assembled monolayers to the reference surface of the soft mold; and transferring the self-assembled monolayers on the soft mold to the substrate.

* * * * *